US011827778B2

(12) United States Patent
Delamotte et al.

(10) Patent No.: US 11,827,778 B2
(45) Date of Patent: Nov. 28, 2023

(54) INK BASED ON FLUORINATED POLYMER HAVING IMPROVED ADHESION

(71) Applicant: Arkema France, Colombes (FR)

(72) Inventors: Marie-France Delamotte, Sainte Foy les Lyon (FR); Stéphane Dornier, Francheville (FR); Manuel Hidalgo, Brignais (FR); Thibaut Soulestin, Lyons (FR)

(73) Assignee: ARKEMA FRANCE, Colombes (FR)

( * ) Notice: Subject to any disclaimer, the term of this patent is extended or adjusted under 35 U.S.C. 154(b) by 480 days.

(21) Appl. No.: 16/622,422

(22) PCT Filed: Jun. 13, 2018

(86) PCT No.: PCT/FR2018/051395
§ 371 (c)(1),
(2) Date: Dec. 13, 2019

(87) PCT Pub. No.: WO2018/229435
PCT Pub. Date: Dec. 20, 2018

(65) Prior Publication Data
US 2020/0207970 A1 Jul. 2, 2020

(30) Foreign Application Priority Data
Jun. 15, 2017 (FR) ...................................... 1755434

(51) Int. Cl.
*C08L 27/16* (2006.01)
*C09D 11/106* (2014.01)
*C09D 11/52* (2014.01)
*H01L 23/29* (2006.01)

(52) U.S. Cl.
CPC ............ *C08L 27/16* (2013.01); *C09D 11/106* (2013.01); *C09D 11/52* (2013.01); *H01L 23/293* (2013.01); *C08L 2203/206* (2013.01)

(58) Field of Classification Search
CPC .......... C08L 27/16; C08L 33/12; C08L 33/14; C08L 2203/206; C09D 11/52; C09D 11/106; C09D 127/16; H01L 23/293
USPC ....................................................... 428/421
See application file for complete search history.

(56) References Cited

U.S. PATENT DOCUMENTS

| 10,626,285 B2 | 4/2020 | Domingues Dos Santos et al. |
| 2004/0002559 A1* | 1/2004 | Troutman .............. C09D 5/185 524/464 |
| 2009/0239981 A1* | 9/2009 | Morimoto ............ C09D 11/106 524/90 |
| 2010/0028643 A1 | 2/2010 | Turevskaya |
| 2011/0065866 A1 | 3/2011 | Leibler et al. |
| 2017/0253760 A1* | 9/2017 | Zheng ...................... C09D 7/20 |
| 2017/0355870 A1 | 12/2017 | Domingues Dos Santos et al. |

FOREIGN PATENT DOCUMENTS

| FR | 2930947 A1 | 11/2009 |
| FR | 3031519 A1 | 7/2016 |
| FR | 3055472 A1 | 3/2018 |
| JP | 2008528727 A | 7/2008 |
| WO | 2006078425 A2 | 7/2006 |
| WO | 2007080338 A2 | 7/2007 |
| WO | 2009141559 A1 | 11/2009 |
| WO | 2009141560 A2 | 11/2009 |
| WO | 2010116105 A1 | 10/2010 |
| WO | 2015124249 A1 | 8/2015 |
| WO | 2016/113492 A1 | 7/2016 |

OTHER PUBLICATIONS

International Search Report (PCT/ISA/210) dated Sep. 24, 2018, by the European Patent Office as the International Searching Authority for International Application No. PCT/FR2018/051395.
Written Opinion (PCT/ISA/237) dated Sep. 24, 2018, by the European Patent Office as the International Searching Authority for International Application No. PCT/FR2018/051395.
Office Action (The Decision of Final Rejection of the Application) dated Sep. 2, 2022, by the China National Intellectual Property Administration in corresponding Chinese Patent Application No. 201880039633.X English Translation only. (8 pages).
Zhou, D. et al.,"Molding and Processing of Polymeric Materials", China Light Industry Press, May 31, 2000, 3 pages.
Office Action (Notice of Rejection) dated May 17, 2022, by the Japanese Patent Office in corresponding Japanese Patent Application No. 2019-569240, and an English Translation of the Office Action. (9 pages).
Office Action (Notice of Rejection) dated Jan. 31, 2023, by the Japanese Patent Office in corresponding Japanese Patent Application No. 219-569240, and an English Translation of the Office Action. (6 pages).
Office Action (Notice of Rejection) dated Apr. 30, 2021 by the European Patent Office in corresponding European Patent Application No. 18748965.3 (5 pages).

* cited by examiner

Primary Examiner — Tri V Nguyen
(74) Attorney, Agent, or Firm — Boone IP Law

(57) ABSTRACT

A composition including: a PF polymer including units derived from vinylidene fluoride; and a PA polymer including units derived from a (meth)acrylic monomer and units including at least one associative group chosen among imidazolidonyl, triazolyl, triazinyl, bis-ureyl and ureidopyrimidyl groups; in solution in a solvent. Also, the use of this composition for the production of electronic devices.

13 Claims, No Drawings

INK BASED ON FLUORINATED POLYMER HAVING IMPROVED ADHESION

FIELD OF THE INVENTION

The invention relates to a fluorinated polymer-based ink having improved adhesion to a substrate as well as the use of this ink in the manufacture of electronic devices.

TECHNICAL BACKGROUND

Fluorinated polymers such as polyvinylidene fluoride (PVDF) and copolymers derived therefrom have a large number of uses, particularly in which they are deposited in the form of a film on a substrate.

Thus, it is known to manufacture electroactive copolymers based on vinylidene fluoride (VDF) and trifluoroethylene (TrFE), possibly containing a third monomer such as chlorotrifluoroethylene (CTFE) or 1,1-chlorofluoroethylene (CFE). Other copolymers, based on VDF and hexafluoropropene (HFP), are useful for forming a protective layer for electronic devices, as described in the patent application FR 16/58014, filed Aug. 29, 2016.

The deposition of such fluorinated polymers in the form of a film may be carried out from a formulation called "ink", consisting of a solution of the fluorinated polymer, and, optionally, additives, in a good solvent.

In a large number of applications, it is required that the thin films obtained from these inks have good adhesive properties with respect to various substrates or layers composing the structure of organic or inorganic devices. However, fluorinated polymers often have insufficient adhesive properties, and sometimes even non-adhesive properties, because of their low surface tension.

Document WO 2009/141559 teaches a composition comprising at least one halogenated vinyl polymer (preferably polyvinyl chloride) and at least one copolymer containing units derived from a first monomer making the copolymer compatible with the halogenated vinyl polymer, and a second monomer carrying at least one associative group. The document discloses the use of the composition in a large number of applications, from stretch films to toys or shoes, through glues and adhesives.

Document WO 2009/141560 has a content close to the previous one. It teaches a method for preparing a polymer resin by mixing two lattices, one formed from at least one halogenated vinyl polymer, and the other formed from a copolymer containing units derived from a first monomer making the copolymer compatible with the halogenated vinyl polymer, and a second monomer carrying at least one associative group.

These documents do not address the problem of the adhesion of the fluorinated polymer films deposited in the form of inks.

There is a need to enhance the adhesive properties of the fluorinated polymer films deposited in the form of inks by using a simple deposition method and by altering the properties of these films as little as possible.

SUMMARY OF THE INVENTION

The invention relates first of all to a composition comprising:
a PF polymer comprising units derived from vinylidene fluoride; and
a PA polymer comprising units derived from a (meth) acrylic monomer and units comprising at least one associative group chosen from imidazolidonyl, triazolyl, triazinyl, bis-ureyl and ureido-pyrimidyl groups; in solution in a solvent.

In certain embodiments, the PF polymer also comprises units derived from at least one other monomer of formula $CX_1X_2\!=\!CX_3X_4$, in which each $X_1$, $X_2$, $X_3$ and $X_4$ group is independently chosen among H, Cl, F, Br, I and alkyl groups comprising from 1 to 3 carbon atoms, which are optionally partially or fully halogenated; and preferably the PF polymer comprises units derived from at least one monomer chosen among trifluoroethylene, tetrafluoroethylene, chlorotrifluoro-ethylene, 1,1-chlorofluoroethylene, hexafluoropropene, 3,3,3-trifluoro-propene, 1,3,3,3-tetrafluoropropene, 2,3,3,3-tetrafluoro-propene, 1-chloro-3,3,3-trifluoropropene and 2-chloro-3,3,3-trifluoropropene.

In certain embodiments, the PF polymer comprises units derived from trifluoroethylene, the proportion of units derived from trifluoroethylene preferably being from 15 to 55 mol % relative to the total of the units derived from vinylidene fluoride and trifluoroethylene.

In certain embodiments, the PF polymer further comprises units derived from an additional monomer, said additional monomer preferably being chlorotrifluoroethylene or 1,1-chlorofluoroethylene, and the proportion of units derived from the additional monomer preferably being from 1 to 20 mol %, more preferably from 2 to 15 mol %, relative to the total of the units of the PF polymer.

In certain embodiments, the PF polymer comprises units derived from hexafluoropropene, preferably in a proportion of 2 to 50 mol %, more preferably of 5 to 40 mol %, relative to the total of the units of the PF polymer.

In some embodiments, the PA polymer comprises:
A units derived from a first monomer, preferably chosen among methyl methacrylate, (methoxy)polyethylene glycol (meth)acrylate and acrylonitrile;
B units derived from a second monomer, said B units comprising an associative group, which is preferably an imidazolidonyl group, and said second monomer preferably being further chosen among ethylimidazolidone methacrylate and ethylimidazolidone methacrylamide;
optionally, C units derived from at least a third monomer, preferably chosen among (meth)acrylic acid, its esters, its amides or its salts, itaconic acid, its esters, its amides or its salts, and styrene and its derivatives such as 4-styrene sulfonate; the third monomer preferably being ethyl acrylate.

In some embodiments, the PA polymer comprises a molar proportion of 50 to 99% A units, of 1 to 20% B units, and of 0 to 49% C units.

In certain embodiments, the PF polymer is present in a proportion of 70 to 99.9% by weight, and preferably in a proportion of 80 to 99% by weight; and the PA polymer is present in a proportion of 0.1 to 30% by weight, and preferably of 1 to 20% by weight; the proportions being given relative to the total of the PF polymer and the PA polymer.

In some embodiments, the solvent is chosen among dimethylformamide, dimethylacetamide, dimethylsulfoxide and ketones, especially acetone, methyl ethyl ketone, methyl isobutyl ketone and cyclopentanone, furans, especially tetrahydrofuran; esters, especially methyl acetate, ethyl acetate, propyl acetate, butyl acetate and propylene glycol methyl ether, carbonates, especially dimethyl carbonate, phosphates, especially triethylphosphate, and mixtures thereof.

The invention also relates to a method for preparing a composition as described above, comprising dissolving the PF polymer, dissolving the PA polymer and mixing these in the solvent.

In certain embodiments, the PA polymer is dissolved in a first portion of the solvent, the PF polymer is dissolved in a second portion of the solvent, then the first portion of the solvent and the second portion of the solvent are mixed; the first portion of the solvent and the second portion of the solvent preferably being of different compositions.

The invention also relates to a method for manufacturing a polymer film, comprising depositing the composition described above on a substrate, and evaporating the solvent from the composition.

The invention also relates to an electronic device comprising a substrate coated with a polymer film manufactured according to the method described above.

In some embodiments, the polymer film is an electroactive polymer film; or the polymer film is a protective film.

In some embodiments, the electronic device is an optoelectronic device and/or is chosen among transistors, especially with a field effect, chips, batteries, photovoltaic cells, light-emitting diodes, especially organic light-emitting diodes, sensors, actuators, transformers, haptic devices, electromechanical microsystems and detectors.

The present invention makes it possible to meet the requirements of the prior art. More particularly, it provides an ink composition comprising a fluorinated polymer in solution in a solvent, allowing the manufacture, in a simple manner, of a fluorinated polymer film (i.e. a layer) on a substrate having improved adhesion to the substrate compared with the prior art, and with little or no alteration of the properties of the film.

This is achieved by combining the fluorinated polymer with an additional polymer of a (meth)acrylic type having associative groups. The present inventors have indeed found that many solvents used for the preparation of inks based on fluorinated polymers also allow the dissolution of such polymers. The two polymers may, therefore, be mixed in a simple manner, without resorting to dry mixing techniques such as extrusion or injection.

Thus, it is possible to obtain an intimate mixture of the polymers at the molecular level, wherein this is preferably at low temperature and without consuming a lot of energy (i.e. under moderate agitation), in equipment that may be accessible to any scale of production from low volumes of a few milliliters to mass production volumes of several tons per mixture, or batch of mixture.

It has also been found that the combination of these two types of polymers makes it possible, even at very low concentrations of additional polymer, to obtain fluorinated polymer films having excellent adhesive properties with respect to different substrates such as, in particular, glass and metals.

In addition, it has been found that the presence of the additional polymer, preferably in a small amount, does not substantially affect the properties of the fluorinated polymer films, whether they are, for example, electroactive properties or planarization or passivation properties, depending on the case.

Another advantage of the invention is that, in some embodiments, the obtained fluorinated polymer layers undergo essentially no discoloration and especially yellowing, as may be the case with some adhesion promoters.

DESCRIPTION OF EMBODIMENTS OF THE INVENTION

The invention is now described in more detail in a non-limitative manner in the description which follows.

The composition according to the invention comprises a PF polymer and a PA polymer, in solution in a solvent.

PF Polymer

The PF polymer has structural units (or units, or repeating units, or patterns) that are derived from (i.e. obtained by polymerization of) vinylidene fluoride (VDF) monomers.

In some embodiments, the PF polymer is a PVDF homopolymer.

It is however preferred that the PF polymer is a copolymer (in the broad sense), i.e. that it comprises units derived from at least one other X monomer than the VDF.

A single X monomer may be used, or several different X monomers, depending on the case.

In certain embodiments, the X monomer may be of the formula $CX_1X_2=CX_3X_4$, wherein each $X_1$, $X_2$, $X_3$ and $X_4$ group is independently selected from H, Cl, F, Br, I and C1-C3 alkyl groups (preferably C1-C2), which are, optionally, partially or fully halogenated—this X monomer being different from the VDF (i.e. if $X_1$ and $X_2$ represent H, at least one of $X_3$ or $X_4$ does not represent F, and if $X_1$ and $X_2$ represent F, at least one of $X_3$ or $X_4$ does not represent H).

In some embodiments, each $X_1$, $X_2$, $X_3$ and $X_4$ group independently represents an H, F, Cl, I or Br atom, or a methyl group optionally comprising one or more substituents selected from F, Cl, I and Br.

In some embodiments, each $X_1$, $X_2$, $X_3$ and $X_4$ group independently represents an H, F, Cl, I or Br atom.

In some embodiments, only one of $X_1$, $X_2$, $X_3$ and $X_4$ represents a Cl or I or Br atom, and the other groups of $X_1$, $X_2$, $X_3$ and $X_4$ independently represent: an H or F atom or a C1-C3 alkyl group, optionally comprising one or more fluorine substituents; preferably, an H or F atom or a C1-C2 alkyl group, optionally comprising one or more fluorine substituents; and more preferably, an H or F atom or a methyl group, optionally comprising one or more fluorine substituents.

Examples of X monomers include: vinyl fluoride (VF), trifluoroethylene (TrFE), tetrafluoroethylene (TFE), hexafluoropropene (HFP), trifluoropropenes and, especially, 3,3,3-trifluoropropene, tetrafluoropropenes and, especially, 2,3,3,3-tetrafluoropropene or 1,3,3,3-tetrafluoropropene (in cis or preferably trans form), hexafluoroisobutylene, perfluorobutylethylene, pentafluoropropenes and, especially, 1,1,3,3,3-pentafluoropropene or 1,2,3,3,3-pentafluoro-propene, perfluoroalkylvinylethers and, especially, those of the general formula $R_f$—O—CF=CF$_2$, $R_f$ being an alkyl group, preferably a C1-C4 group (preferred examples being perfluoropropylvinylether or PPVE and perfluoromethylvinylether or PMVE).

In some embodiments, the X monomer comprises a chlorine or bromine atom. It may in particular be chosen among bromotrifluoroethylene, chlorofluoroethylene, chlorotrifluoroethylene and chlorotrifluoropropene. Chlorofluoroethylene may refer to either 1-chloro-1-fluoroethylene or 1-chloro-2-fluoroethylene. The 1-chloro-1-fluoroethylene isomer (CFE) is preferred. The chlorotrifluoropropene is preferably 1-chloro-3,3,3-trifluoropropene (in cis or trans form, preferably trans) or 2-chloro-3,3,3-trifluoropropene.

In certain preferred embodiments, the PF polymer comprises units derived from VDF and HFP, or is a P(VDF-HFP) polymer consisting of units derived from VDF and HFP.

Such a PF polymer is particularly useful for the manufacture of planarization or passivation layers of electronic devices.

Such a PF polymer may also be useful for the manufacture of electroactive layers.

The molar proportion of repeating units derived from HFP is preferably from 2 to 50%, in particular from 5 to 40%.

The P(VDF-HFP) copolymer may especially be as described in the documents WO 01/32726 and U.S. Pat. No. 6,586,547 to which reference is expressly made.

In some preferred embodiments, the PF polymer comprises units derived from VDF and CFE, or CTFE, or TFE, or TrFE, or TFE. The molar proportion of repeating units derived from monomers different from VDF is preferably less than 30%, more preferably less than 20%.

Such a PF polymer is particularly useful for the manufacture of electroactive layers.

In some preferred embodiments, the PF polymer comprises units derived from VDF and TrFE, or is a P(VDF-TrFE) polymer consisting of units derived from VDF and TrFE.

Such a PF polymer is particularly useful for the manufacture of electroactive layers.

In certain preferred embodiments, the PF polymer comprises units derived from VDF, TrFE and another X monomer as defined above, different from VDF, and TrFE, or else is a P(VDF-TrFE-X) polymer consisting of units derived from VDF, TrFE and another X monomer as defined above, different from VDF and TrFE. Preferably, in this case, the other X monomer is chosen among TFE, HFP, trifluoropropenes and especially 3,3,3-trifluoropropene, tetrafluoro-propenes and especially 2,3,3,3-tetrafluoropropene or 1,3,3,3-tetrafluoropropene (in cis or, preferably, trans form), bromotrifluoro-ethylene, chlorofluoroethylene, chlorotrifluoroethylene and chlorotrifluoropropene. CTFE or CFE are particularly preferred.

Such a PF polymer is particularly useful for the manufacture of electroactive layers.

When units derived from VDF and TrFE are present, the proportion of units derived from TrFE is preferably from 5 to 95 mol % relative to the total of the units derived from VDF and TrFE, and especially: from 5 to 10 mol. %; or from 10 to 15 mol %; or from 15 to 20 mol %; or from 20 to 25 mol %; or from 25 to 30 mol %; or from 30 to 35 mol %; or from 35 to 40 mol %; or from 40 to 45 mol %; or from 45 to 50 mol %; or from 50 to 55 mol %; or from 55 to 60 mol %; or from 60 to 65 mol %; or from 65 to 70 mol %; or from 70 to 75 mol %; or from 75 to 80 mol %; or from 80 to 85 mol %; or from 85 to 90 mol %; or from 90 to 95 mol %. A range of 15 to 55 mol % is particularly preferred.

When units derived from another X monomer, in addition to VDF and TrFE, are present (the X monomer being especially CTFE or CFE), the proportion of units derived from this other X monomer in the PF polymer (relative to the total of the units) may vary, for example, from 0.5 to 1 mol %; or from 1 to 2 mol %; or from 2 to 3 mol %; or from 3 to 4 mol %; or from 4 to 5 mol %; or from 5 to 6 mol %; or from 6 to 7 mol %; or from 7 to 8 mol %; or from 8 to 9 mol %; or from 9 to 10 mol %; or from 10 to 12 mol %; or from 12 to 15 mol %; or from 15 to 20 mol %; or from 20 to 25 mol %; or from 25 to 30 mol %; or from 30 to 40 mol %; or from 40 to 50 mol %. Ranges of 1 to 20 mol %, and preferably of 2 to 15 mol %, are particularly suitable.

The molar composition of the units in the fluorinated polymers may be determined by various means such as infrared spectroscopy or RAMAN spectroscopy. Conventional methods for elemental analysis in carbon, fluorine and chlorine or bromine or iodine elements, such as X-ray fluorescence spectroscopy, make it possible to calculate without ambiguity the mass composition of the polymers, from which the molar composition is deduced.

Multi-core NMR techniques, especially proton (1H) and fluorine (19F) techniques may also be implemented by analyzing a solution of the polymer in a suitable deuterated solvent. The NMR spectrum is recorded on an FT-NMR spectrometer equipped with a multi-nuclear probe. The specific signals given by the different monomers are then identified in the spectra produced according to one or the other nucleus. Thus, for example, the unit derived from TrFE gives in NMR of proton a specific signal characteristic of the CFH group (at about 5-7 ppm, when the solvent is pyridine, for example). It is the same for $CH_2$ groups of VDF (massive between 2-4 ppm, when the solvent is pyridine, for example). The relative integration of the two signals gives the relative abundance of the units derived from the two monomers, i.e. the molar ratio VDF/TrFE.

In the same way, the $CF_3$ group, for example, gives characteristic and well isolated signals in NMR of fluorine. The combination of the relative integrations of the different signals obtained by proton NMR and by fluorine NMR leads to a system of equations whose resolution leads to obtaining the molar concentrations of the units derived from the different monomers.

Finally, it is possible to combine elemental analysis, for example for heteroatoms such as chlorine or bromine or iodine, and NMR analysis. Thus, the content of units derived from CTFE in a P(VDF-TrFE-CTFE) terpolymer, for example, may be determined by a measurement of the chlorine content by elemental analysis.

The skilled in the art thus has a range of methods or combination of methods allowing him to determine without ambiguity and with the necessary precision, the composition of fluorinated polymers.

The viscosity of the PF polymer is preferably from 0.1 to 100 kPo (kiloPoise) by carrying out the measurement at 230° C. and at 100 $s^{-1}$ shear rate (according to ASTM D4440, using a PHYSICA MCR301 device equipped with two parallel trays).

The PF polymer is preferably random and linear.

The PF polymer may be homogeneous or heterogeneous. A homogeneous polymer has a uniform chain structure, wherein the statistical distribution of the units derived from different monomers does not vary substantially between the chains. In a heterogeneous polymer, the chains have a distribution in units derived from the different monomers of the multimodal or spreading type. A heterogeneous polymer, therefore, comprises chains richer in a given unit and chains poorer in this unit. An example of a heterogeneous polymer is disclosed in WO 2007/080338.

The PF polymer may be produced by using any known method, such as emulsion polymerization, suspension polymerization and solution polymerization.

When the fluoropolymer comprises units derived from VDF and/or TrFE as well as from another X monomer as described above, it is preferable to use the method described in document WO 2010/116105. This method makes it possible to obtain polymers of high molecular weight and suitable structuring.

In short, the preferred method comprises the following steps:
  loading an initial mixture containing only VDF and/or TrFE (without the other X monomer) in a stirred autoclave containing water;
  heating the autoclave to a predetermined temperature, close to the polymerization temperature;
  injection of a radical polymerization initiator mixed with water into the autoclave, in order to reach a pressure in the autoclave which is preferably at least 80 bars, in order to form a suspension of monomers of VDF and/or TrFE in water;

injection of a second mixture of VDF and/or TrFE and X into the autoclave;

as soon as the polymerization reaction starts, the continuous injection of the said second mixture into the autoclave reactor, in order to maintain the pressure at a substantially constant level, preferably of at least 80 bars.

The radical polymerization initiator may especially be an organic peroxide of the peroxydicarbonate type. It is generally used in an amount of 0.1 to 10 grams per kilogram of the total monomer charge. Preferably, the amount used is from 0.5 to 5 g/kg.

The initial mixture advantageously comprises only VDF and/or TrFE in a proportion equal to that of the desired final polymer.

Advantageously, the second mixture has a composition which is adjusted so that the total monomer composition introduced into the autoclave, including the initial mixture and the second mixture, is equal to, or approximately equal to, the composition of the desired final polymer.

The weight ratio of the second mixture to the initial mixture is preferably from 0.5 to 2, more preferably from 0.8 to 1.6.

The implementation of this method with an initial mixture and a second mixture makes the method independent of the start-up phase of the reaction, which is often unpredictable. The polymers thus obtained are in the form of a powder, without crust or skin.

The pressure in the autoclave reactor is preferably from 80 to 110 bar, and the temperature is maintained at a level of preferably 40° C. to 60° C.

The second mixture may be injected continuously into the autoclave. It may be compressed before being injected into the autoclave, for example by using a compressor or two successive compressors, generally at a pressure greater than the pressure in the autoclave.

After synthesis, the polymer may be washed and dried.

The average molar mass by weight Mw of the PF polymer is preferably at least 100000 g·mol$^{-1}$, preferably at least 200000 g·mol$^{-1}$, and more preferably at least 300000 g·mol$^{-1}$, or at least 400000 g·mol$^{-1}$. It may be adjusted by modifying certain method parameters, such as the temperature in the reactor, or by adding a transfer agent.

The molecular weight distribution may be estimated by SEC (size exclusion chromatography) with dimethylformamide (DMF) as eluent, with a set of 3 columns of increasing porosity. The stationary phase is a styrene-DVB gel. The detection method is based on a measurement of the refractive index, and the calibration is performed with polystyrene standards. The sample is dissolved in 0.5 g/L in DMF and filtered through a 0.45 μm nylon filter.

PA Polymer

The PA polymer is an acrylic polymer, i.e. it comprises at least units derived from a (meth)acrylic monomer. In addition, the PA polymer comprises units comprising at least one associative group chosen among imidazolidonyl, triazolyl, triazinyl, bis-ureyl and ureido-pyrimidyl groups. The units comprising this associative group are preferably themselves derived from a (meth)acrylic monomer.

Preferably, the PA polymer comprises at least 50 mol %, more preferably at least 60 mol %, or at least 70 mol %, or at least 80 mol %, or at least 90 mol %, or at least 95 mol % or at least 98 mol % of (meth)acrylic monomers. In some embodiments, the totality of the PA polymer is comprised of units derived from (meth)acrylic monomers.

By (meth)acrylic monomer is meant acrylic acid or methacrylic acid and their derivatives, and, especially: alkyl acrylates and methacrylates, hydroxyalkyl acrylates and methacrylates, amides derived from acrylic acid or methacrylic acid, acrylonitrile, glycidyl acrylates and methacrylates . . . .

In some embodiments, the PA polymer comprises:

A units derived from a first monomer;

B units derived from a second monomer and carrying an associative group;

optionally, C units derived from at least one third monomer.

The first monomer is a (meth)acrylic monomer. The first monomer is preferably chosen among methyl methacrylate, (methoxy)polyethylene glycol (meth)acrylate and acrylonitrile.

In a particularly preferred manner, it is methyl methacrylate.

The A units derived from the first monomer are preferably present in the PA polymer in a molar proportion of 50 to 99%, more preferably of 60 to 97%, more preferably of 70 to 95%, and more preferably of 80 to 90%.

The B units carry at least one associative group. By "associative groups" is meant groups capable of associating with each other by hydrogen bonds or by pi stacking, or by ionic bonds, or by Van der Waals bonds, or by halogen bonds, and, advantageously, by 1 to 6 hydrogen bonds. The associative groups used according to the invention are more specifically chosen among imidazolidonyl, triazolyl, triazinyl, bisureyl, ureido-pyrimidyl groups, and combinations thereof. Imidazolidonyl groups are preferred.

Preferably, the second monomer is a (meth)acrylic monomer. Thus, the second monomer is more preferably chosen among ethylimidazolidone methacrylate and ethylimidazolidone methacryl-amide.

The B units are preferably present in the PA polymer in a molar proportion of 1 to 20%, more preferably of 2 to 15%, more preferably of 3 to 12%, and more preferably of 5 to 10%.

The third monomer is preferably a (meth)acrylic monomer as defined above, or itaconic acid, one of its esters, amides or salts, or styrene or one of its derivatives such as 4-styrene sulfonate, or even a combination thereof (when the C units are formed from several monomers). More preferably, the third monomer is a (meth)acrylic monomer, such as, for example, ethyl acrylate.

The C units are preferably present in the PA polymer in a molar proportion of 0 to 49%, more preferably of 1 to 30%, more preferably of 2 to 20%, and more preferably of 5 to 10%.

In particular embodiments, the PA polymer comprises, in molar proportions:

from 50 to 99%, more preferably from 60 to 97%, more preferably from 70 to 95%, and more preferably from 80 to 90%, of units derived from methyl methacrylate;

from 1 to 20%, more preferably from 2 to 15%, more preferably from 3 to 12%, and more preferably from 5 to 10%, of units derived from ethylimidazolidone methacrylate; and from 0 to 49%, more preferably from 1 to 30%, more preferably from 2 to 20%, and more preferably from 5 to 10%, of units derived from ethyl acrylate.

In some embodiments, the associative groups may be introduced during the polymerization of the PA polymer. The PA polymer is thus capable of being obtained by copolymerization of the first monomer with the second monomer which carries the associative groups, and optionally one or more third C monomers.

Such a PA polymer may be prepared according to known methods of radical polymerization in solution in solvents such as chloroform or tetrahydrofuran or in a dispersed medium such as, in particular, in suspension or in aqueous emulsion.

In a preferred embodiment, it may be obtained by radical polymerization in suspension or in aqueous emulsion. In the case of polymerizations in solution or in aqueous suspension, the polymerization may be initiated using radical polymerization initiators that are soluble in the mixture of monomers. Different radical generation mechanisms may be implemented such as, for example, thermal decomposition, oxidation-reduction reactions, decomposition caused by electromagnetic radiation and, in particular, ultraviolet radiation.

For further details, reference is made to WO 2009/141559, in particular with regard to:
- examples of possible initiators, which may be used in particular at a content of 0.05 to 10% by weight relative to the total weight of the monomers;
- examples of chain transfer agents, which are optional (and which are generally used at a content of 0.01 to 10%, and preferably of 0.5 to 2% by weight relative to the total weight of the monomers);
- examples of other possible additives, including antioxidants, biocides and/or activators of polymerization initiators (which are generally used at a content of 0.01% and 5% by weight relative to the total weight of the monomers);
- examples of suspension agents in the case of suspension polymerization (which are generally used at a content from 0.05 to 10%, preferably from 0.1 to 5% by weight relative to the total weight of the dispersed phase containing the monomers);
- examples of salts or pH regulators which may be used in combination with suspending agents (which are generally used at a content of 0.05 to 5% by weight relative to the total weight of the continuous aqueous phase);
- examples of surfactants or stabilizers useful for polymerization in aqueous emulsion (which are generally used at a content of 0.1 to 10% by weight relative to the total weight of the monomers);
- conditions of temperature, pressure and concentration that may be used during the polymerization.

In other embodiments, the PA polymer may be obtained by grafting the associative groups onto an already constituted polymer comprising A and optionally C units, as well as B units comprising at least one reactive function, such as an acid, anhydride, alcohol, mercaptan, amine, epoxy or isocyanate function, preferably anhydride, by reaction of one or more modifying agents carrying, on the one hand, an associative group and, on the other hand, a reactive group, chosen among amino, mercaptan, epoxy isocyanate, anhydride, alcohol groups, preferably amine, wherein the said reactive group is capable of forming a covalent bond with said reactive function.

For further details, reference is again made to the document WO 2009/141559 concerning inter alia the conditions of the reaction, and, especially the use of catalysts and additives, the contents of the different species, as well as examples of modification agents.

The PA polymer is chosen in order to be compatible with the PF polymer. This means that the two polymers form a homogeneous mixture, in that they exhibit a degree of viscosity such that at least the amorphous phase of the PF polymer and the amorphous phase of the PA polymer form only a single phase. Miscibility may be identified by different analytical methods, such as scanning electron microscopy (SEM) or transmission electron microscopy (TEM) or even atomic force microscopy (AFM), which allow to identify inhomogeneities of mixtures in the form of characteristic areas of size greater than 1 micron, which are the sign of immiscibility. It may also be identified by glass transition temperature (Tg) measurements of the mixture of the two polymers: the miscibility then results in the existence of a single Tg for the mixture. Methods for measuring the Tg of polymers and polymer blends include differential scanning calorimetry (DSC), volumetry or dynamic mechanical analysis (DMA).

The use of a PA polymer based on methyl methacrylate is particularly favorable in order for the PA polymer to be compatible with the PF polymer.

The PA polymer preferably has a number average molecular mass of between 5,000 g/mol and 500,000 g/mol, more preferably between 15,000 g/mol and 100,000 g/mol, and particularly preferably between 25,000 g/mol and 50000 g/mol.

Solvent and Additives

According to the invention, the PA and PF polymers are dissolved in a solvent. By "solution" is meant a homogeneous dispersion of the polymers in the solvent at the molecular level. The term solution is used herein as opposed to a suspension of polymer particles in a liquid vehicle, and as opposed to an emulsion or polymer latex.

The composition comprising the solvent and the PA and PF polymers (and, optionally, additional compounds such as additives) is also called ink.

Preferably, the solvent is chosen among: dimethylformamide; dimethylacetamide; dimethylsulfoxide; ketones, especially acetone, methyl ethyl ketone (or butan-2-one), methyl isobutyl ketone and cyclopentanone; furans, especially tetrahydrofuran; esters, especially methyl acetate, ethyl acetate, propyl acetate, butyl acetate and propylene glycol methyl ether acetate; carbonates, especially dimethyl carbonate; phosphates, especially triethylphosphate. Mixtures of these compounds may also be used.

The mass proportion of PF polymer(s) relative to the total of the PA and PF polymer(s) in the composition may be, especially: from 50 to 60%, or from 60 to 70%, or from 70 to 75%, or from 75 to 80%, or from 80 to 85%, or from 85 to 90%, or from 90 to 95%, or from 95 to 98%, or from 98 to 99%, or from 99 to 99.9%. Conversely, the mass proportion of PA polymers relative to the total of the PA and PF polymer(s) in the composition may be especially: from 0.1 to 1%, or from 1 to 2%, or from 2 to 5%, or from 5 to 10%, or from 10 to 15%, or from 15 to 20%, or from 20 to 25%, or from 25 to 30%, or from 30 to 40%, or from 40 to 50% %.

The composition preferably contains from 0.1 to 60%, preferably from 0.5 to 30%, more preferably from 1 to 20%, more preferably from 3 to 15% by weight of PA and PF polymers (together), relative to the total composition.

The ink may optionally comprise one or more additives, especially chosen among surface-tension modifiers, rheology-modifying agents, aging-modifying agents, adhesion-modifying agents, pigments or dyes, fillers (including nanofillers). Preferred additives are especially co-solvent modifiers of the surface tension of the ink. In particular, they may be organic compounds that are miscible with the solvents used. Examples include compounds of the family of linear or cyclic alkanes, such as heptane and cyclohexane, decane or dodecane, and aromatic compounds such as toluene or ethylbenzene.

The ink composition may also contain one or more additives used for the synthesis of the polymer(s).

In certain embodiments in which it is desired to crosslink the polymers after deposition of the composition, the ink comprises at least one crosslinking aid additive, preferably chosen among radical initiators, co-agents such as bifunctional or polyfunctional molecules in terms of reactive double bonds, basic crosslinking agents such as di-amines, and combinations thereof.

In particular, it is possible to use a photoinitiator which may, for example, be chosen among 2-hydroxy-2-methyl-1-phenyl-propan-1-one, 2,4,6-trimethylbenzoyl-diphenylphosphineoxide, 2,4,6-trimethyl benzoyl-diphenylphosphineoxide, trimethylbenzoylphenyl phosphinate, 1-hydroxycyclohexylphenylketone, bis(2,6-dimethoxybenzoyl)-2,4,4-trimethylpentylphosphine oxide, 1-[4-(2-hydroxyethoxy)-phenyl)2-hydroxy-2-methyl-1-propan-1-one, 2,2-dimethoxy-1,2-diphenylethan-1-one, 2-methyl-1[4-(methylthio)phenyl]-2-morpholinopropan-1-one, 2,4-diethylthioxanthone, their derivatives, and mixtures thereof.

In particular, it is possible to use a crosslinking agent chosen among bi or polyfunctional (meth)acrylic monomers or oligomers in terms of reactive double bonds. These bi or polyfunctional (meth)acrylic monomers or oligomers may have chemical structures derived from functions other than the strict alkane chemistry, such as diols, triols or polyols, polyesters, ethers, polyethers, polyurethanes, epoxys, cyanurates or isocyanurates. For example we can cite: 1,3-butylene glycol di(meth)acrylate, butanediol di(meth)acrylate, 1,6-hexanediol di(meth)acrylate, hexanediol alkoxylated di(meth)acrylate, neopentyl glycol alkoxylated di(meth)acrylate, dodecyl di(meth)acrylate, cyclohexane dimethanol di(meth)acrylate, diethylene glycol di(meth)acrylate, dipropylene glycol di(meth)acrylate, linear alkanes di(meth)acrylates, bisphenol A ethoxylated di(meth)acrylate, ethylene glycol di(meth)acrylate, neopentyl glycol di(meth) acrylate, tricyclodecane dimethanol diacrylate, triethylene glycol di(meth)acrylate, tetraethylene glycol di(meth)acrylate, tripropylene glycol di(meth)acrylate, ditrimethylolpropane tetra (meth)acrylate, pentaerythritol ethoxylated tetra(meth)acrylate, dipentaerythritol penta(meth)acrylate, penta(meth)acrylate ester, pentaerythritol tetra (meth)acrylate, ethoxylated trimethylolpropane tri(meth) acrylate, trimethylolpropane alkoxylated tri(meth)acrylate, trimethylolpropane tri(meth)acrylate, pentaerythritol tri (meth)acrylate, trimethylolpropane propoxylated tri(meth) acrylate, trimethylolpropane trimethacrylate, dodecanediol di(meth)acrylate, dodecane di(meth) acrylate, dipentaerythritol penta/hexa(meth)acrylate, pentaerythritol tetra(meth) acrylate, di-trimethylolpropane tetra(meth)acrylate, glyceryl propoxylated tri(meth)acrylate, tris(2-hydroxyethyl)isocyanurate tri(meth)acrylate, polyesters (meth) acrylates, polyethers (meth)acrylates, polyethylene glycols (meth) acrylates, polypropylenes glycol (meth)acrylates, polyurethanes (meth)acrylates, epoxy (meth)acrylates and combinations thereof.

In other (preferred) embodiments, no crosslinking aid additive, such as a photoinitiator or a crosslinking agent, is present in the ink.

The total content of additives is preferably less than 20% by weight, more preferably less than 10% by weight, relative to the total PA and PF polymers and additives.

The ink preferably has a nonvolatile solids content of 0.1 to 60%, preferably of 0.5 to 30%, more preferably of 1 to 20%, more preferably of 3 to 15% by weight.

Preparation of the Composition

The ink composition according to the invention may be prepared by dissolving the PA polymer, dissolving the PF polymer, and then mixing them. The dissolution of the PA and PF polymers may be simultaneous or not as described below.

The temperature applied during this preparation is preferably from 0 to 60° C., more preferably from 10 to 50° C., more preferably from 15 to 40° C., and ideally from 20 to 30° C. In some embodiments, the preparation is carried out at room temperature. Advantageously, the preparation is carried out with moderate agitation.

In some embodiments, the PA polymer is dissolved in the solvent on one side, and the PF polymer is dissolved in the same solvent on the other side, then the two solutions are mixed. The solvent used may be formed by a single compound or by a mixture of compounds that are miscible with each other.

In other embodiments, one of the PA and PF polymers is dissolved in the solvent, then the other of the PA or PF polymers is added to the solution and dissolved in turn. The solvent used may be formed by a single compound or by a mixture of compounds miscible with each other.

In still other embodiments, the solvent of the ink composition is a mixture of a first solvent and a second solvent of different compositions and miscible with each other. The PA polymer is dissolved in the first solvent to form a first solution, while the PF polymer is dissolved in the second solvent to form a second solution, then the first solution and the second solution are mixed to form the ink composition of the invention. The first solvent and the second solvent may each be formed by a single compound or a mixture of compounds that are miscible with each other. For example, the first solvent and the second solvent may each be formed by mixtures of the same compounds, but in different proportions between the first solvent and the second solvent.

When additives need to be added to form the ink composition of the invention, they may be added before, during or after the dissolution of the PA and PF polymers.

The miscibility of solvent compounds with each other, or of solvents with each other, is verified by obtaining a transparent and homogeneous solution after mixing, at the preparation temperature which is used (and preferably at room temperature).

Using the Composition

The substrate on which the ink is deposited may, especially be a surface of glass, or of silicon, or of quartz, or of polymeric material (especially polyethylene terephthalate or polyethylene naphthalate), or of metal, or a mixed surface composed of several different materials.

The application of the ink may comprise spreading by discrete or continuous means. The deposition may be carried out, especially by coating by centrifugation ("spin-coating"), by spraying or atomization ("spray coating"), by coating especially with a bar or a film-puller ("bar coating"), by coating with a slit head, by immersion ("dip coating"), by roller printing ("roll-to-roll printing"), by silk-screen printing, by flexographic printing, by lithographic printing or jet printing ink.

The solvent is evaporated after the deposition. The polymer layer then solidifies to form a continuous film by interdiffusion of the polymer molecules. The evaporation may be carried out at room temperature and/or by heating at a temperature preferably from 30 to 200° C., more preferably from 50 to 180° C., more preferably from 80 to 160° C. The layer may be subjected to a ventilation to facilitate evaporation. The duration of the evaporation may be, for example, from 1 minute to 24 hours, preferably from 5 minutes to 5 hours, more preferably from 10 minutes to 2 hours.

An annealing step may be carried out after evaporation of the solvent, for example to allow crystallization of the polymer. The annealing may, especially be carried out by subjecting the deposited layer to a temperature of 50 to 200° C., preferably of 80 to 180° C., more preferably of 100 to 160° C., especially of 120 to 150° C.

The fluorinated polymer/polymer carrying associative units layer thus formed may have, especially a thickness of 50 nm to 100 μm, preferably 200 nm to 50 μm, and more preferably 500 nm to 20 μm.

According to a variant of the invention, a crosslinking step may be carried out by subjecting the layer to radiation, such as X, gamma, UV radiation or by thermal activation if the annealing step is not sufficient. Preferably, UV irradiation is used. Preferably, all or part of the radiation has a wavelength in a spectral range of 150 to 410 nm, preferably of 315 to 410 nm. Preferably, the irradiation comprises wavelengths at 365 nm and/or 385 nm and/or 405 nm. More preferably, the radiation dose applied is less than 20 J/cm$^2$, or even less than 10 J/cm$^2$.

The film according to the invention may be used as an electro-active layer and/or as a dielectric layer in an electronic device, and, especially when the PF polymer is a P(VDF-TrFE) or P(VDF-TrFE-CFE) or P(VDF-TrFE-CTFE) copolymer as described above. The film according to the invention thus advantageously has a dielectric permittivity at 25° C. and 1 kHz greater than 8, preferably greater than 10 and more particularly greater than 12. Advantageously, the film also has a saturation polarization greater than 30 mC/m$^2$, preferably greater than 50 mC/m$^2$.

The measurement of dielectric permittivity may be carried out by means of a LCR meter Sefelec LCR 819, which makes it possible to measure a capacity which is proportional to the permittivity.

The saturation polarization may be obtained by applying an alternating electric field of increasing amplitude and of a frequency of 50 mHz by means of electrodes on an area of 1 mm$^2$ of the film. The current passing through the sample is measured as a function of the electric field applied via a precision ammeter. The current measurement provides access to the saturation polarization.

One or more additional layers may be deposited on the substrate provided with the film of the invention, for example one or more layers of polymers, semiconductor materials, or metals, in a manner known per se.

By electronic device is meant either a single electronic component or a set of electronic components, capable of performing one or more functions in an electronic circuit.

According to certain variations, the electronic device is more particularly an optoelectronic device, i.e. capable of emitting, detecting or controlling electromagnetic radiation.

Examples of electronic devices, or possibly optoelectronic devices, concerned by the present invention are transistors (especially with a field effect), chips, batteries, photovoltaic cells, light-emitting diodes (LEDs), organic light-emitting diodes (OLED), sensors, actuators, transformers, haptic devices, electromechanical microsystems and detectors.

Electronic and optoelectronic devices are used and integrated in many electronic apparatuses, equipment or subassemblies and in many objects and applications such as televisions, mobile phones, rigid or flexible screens, thin-film photovoltaic modules, lighting sources, energy sensors and converters, etc.

Alternatively, the layer may be used as a protective coating (or encapsulation) for an electronic device, and, especially when the PF polymer is a copolymer P(VDF-HFP) as described above. Such a protective coating may be used alone or in combination with other protective films.

In this case, the electronic device may, especially comprise a substrate and electronic elements supported on it, which may comprise layers of conductive material, semi-conductive material and others. The electronic elements are preferably on one side of the substrate but in some embodiments they may be on both sides of the substrate. The layer may cover all or part of the electronic elements, and all or part of the substrate. Preferably, the layer covers at least a part of the substrate and at least a part of the electronic elements, and performs a planarizing function. The layer may cover only one of the two faces of the substrate (preferably the face which comprises the electronic elements), in whole or in part, or, alternatively, the two faces of the substrate, in whole or in part.

When the layer is used as a protective coating for an electronic device, the electronic device may be of the same type as above.

EXAMPLES

The following examples illustrate the invention without limiting it.

Example 1 Invention

Into a stirred glass reactor equipped with a jacket in which circulates a heat transfer fluid allowing to heat the reactor contents and, optionally, cooling it, and also equipped with a vapor condensation system (reflux) with the aid of a water-cooled refrigerant, and a nitrogen sparge system, are introduced 80.51 g of methyl ethyl ketone (MEK), 13.32 g of an electroactive fluorinated copolymer of relative molar composition determined by nuclear magnetic resonance (NMR) spectroscopy of 80±2% of units derived from VDF and 20±2% of units derived from TrFE, and 0.35 g of a methacrylic copolymer carrying associative groups of relative molar composition determined by nuclear magnetic resonance (NMR) spectroscopy of 85±2% of units derived from methyl methacrylate, 7.5±1% of units derived from ethyl acrylate and 7.5±1% of units derived from methacrylate ethyl imidazolidone (MEIO). The preparation of the solution is continued by gentle stirring at 35° C. under total reflux and with nitrogen sparging until the two polymers initially added in the form of powder have completely dissolved.

Polymer films are prepared by coating with a bar of a glass plate from the above solution. The glass plate is deposited in a ventilated grid, at room temperature, for 30 minutes, to allow at least partial evaporation of the solvent. It is then placed for 20 minutes in a ventilated oven previously heated to 140° C. to allow the total evaporation of the solvent.

Example 2 Comparative

In Example 2, an ink is manufactured and a polymer layer is deposited in the same manner as in Example 1, but omitting the methacrylic copolymer.

Example 3—Characterization

The polymer layers according to Example 1 and according to Example 2, of approximately 20 µm in thickness, are tested as follows.

The adhesive properties of the layer on the glass plate are evaluated according to the ASTM D3359 tape test, using an ERICHSEN Model 259 grid comb.

The notation in this test has the following meaning:

Note 0: cut edges completely smooth, without splinters. No loss of coating.

Note 1: slight flaking at intersection points, with a coating loss that is not significantly greater than 5% over the total grid area.

Note 2: flaking along cut edges and/or at intersection points, with a coating loss that is significantly greater than 5% but that is not significantly greater than 15% of the total area.

Note 3: flaking along the cut edges and/or squares, with a coating loss that is significantly greater than 15% but that is not significantly greater than 35% of the total area.

Note 4: flaking along cut edges and/or squares, with a coating loss that is significantly greater than 35% but that is not significantly greater than 65% of the total area.

Note 5: flaking with a loss of coating that is significantly greater than 65% of the total area.

The electro-activity of the films is evaluated by polarization of the film giving access to the values of coercive field ($E_C$), remanent polarization ($P_r$), and saturation polarization ($P_{sat}$). An alternating electric field of increasing amplitude and of a frequency of 50 mHz is applied through the electrodes to an area of 1 mm² of the film. The current passing through the sample is measured as a function of the electric field applied via a precision ammeter.

The measurement of the piezoelectric coefficient $d_{33}$, performed on a Berlincourt piezometer, makes it possible to check the influence of the addition of the additive on the piezoelectric properties.

The results are summarized in the table below.

|  | $E_C$ | $P_r$ | $P_{sat}$ | $d_{33}$ | Adhesion |
| --- | --- | --- | --- | --- | --- |
| Example 2 (comparative) | 46.07 | 91.9 | 97.2 | 27.0 | 5 |
| Example 1 (invention) | 44.30 | 85.5 | 92.6 | 25.1 | 2 |

There is a slight decrease in electroactive priorities (less than 7%) but a very strong increase in adhesion on the glass plate (the score of 2 being much better than that of 5, in the "tape-test").

The invention claimed is:

1. A polymer-based ink comprising:
   an electroactive PF polymer comprising units derived from vinylidene fluoride and units derived from trifluoroethylene,
   wherein the proportion of units derived from trifluoroethylene is from 15 to 55 mol % relative to the total of units derived from vinylidene fluoride and trifluoroethylene, and
   a PA polymer comprising units derived from a (meth) acrylic monomer and units comprising at least one associative group chosen among imidazolidonyl, triazolyl, triazinyl, bis-ureyl and ureido-pyrimidyl groups; in solution in a solvent,
   the solvent being chosen from the group consisting of dimethylformamide, dimethylacetamide, dimethylsulfoxide, ketones, furans, esters, methyl acetate, ethyl acetate, propyl acetate, butyl acetate, propylene glycol methyl ether, carbonates, phosphates, and mixtures thereof.

2. The polymer-based ink according to claim 1, in which the electroactive PF polymer also comprises units derived from at least one other monomer of formula $CX_1X_2=CX_3X_4$, in which each $X_1$, $X_2$, $X_3$ and $X_4$ group is independently chosen among H, Cl, F, Br, I and alkyl groups comprising from 1 to 3 carbon atoms, which are optionally partially or fully halogenated.

3. The polymer-based ink according to claim 1, wherein the electroactive PF polymer further comprises units derived from an additional monomer, said additional monomer being chlorotrifluoroethylene or 1,1-chlorofluoroethylene.

4. The polymer-based ink according to claim 1, wherein the electroactive PF polymer comprises units derived from hexafluoropropene.

5. The polymer-based ink according to claim 1, wherein the PA polymer comprises:
   A units derived from a first monomer, chosen among methyl methacrylate and (methoxy)polyethylene glycol (meth)acrylate;
   B units from a second monomer comprising an imidazolidonyl group;
   optionally, C units derived from at least a third monomer, chosen among (meth)acrylic acid, its esters, its amides or its salts, itaconic acid, its esters, its amides or its salts, and styrene and its derivatives.

6. The polymer-based ink according to claim 5, wherein the PA polymer comprises a molar proportion of 50 to 99% A units, of 1 to 20% B units, and of 0 to 49% C units.

7. The polymer-based ink according to claim 1, wherein the electroactive PF polymer is present in a proportion of 70 to 99.9% by weight; and the PA polymer is present in a proportion of 0.1 to 30% by weight; the proportions being given relative to the total of the electroactive PF polymer and the PA polymer.

8. A method for preparing a polymer-based ink according to claim 1, comprising dissolving the electroactive PF polymer, dissolving the PA polymer and mixing them in the solvent.

9. The method according to claim 8, wherein the PA polymer is dissolved in a first portion of the solvent, the electroactive PF polymer is dissolved in a second portion of the solvent, then the first portion of the solvent and the second portion of the solvent are mixed.

10. A method of manufacturing a polymer film, comprising depositing the polymer-based ink according to claim 1 on a substrate, and evaporating of the solvent from the polymer-based ink.

11. An electronic device comprising a substrate coated with a polymer film manufactured according to the method of claim 10.

12. The electronic device according to claim 11, wherein the polymer film is an electroactive polymer film; or wherein the polymer film is a protective film.

13. The electronic device according to claim 11, which is an optoelectronic device chosen from the group consisting of chosen among transistors, chips, batteries, photovoltaic cells, light-emitting diodes, sensors, actuators, transformers, haptic devices, microelectromechanical systems and detectors.

* * * * *